(12) United States Patent
Hollweck et al.

(10) Patent No.: US 12,389,573 B2
(45) Date of Patent: Aug. 12, 2025

(54) POWER MODULE AND POWER ELECTRONICS DEVICE

(71) Applicant: Valeo Siemens eAutomotive Germany GmbH, Erlangen (DE)

(72) Inventors: Benedikt Hollweck, Erlangen (DE); Christian Herold, Erlangen (DE); Monzer Rayya, Erlangen (DE)

(73) Assignee: Valeo Siemens eAutomotive Germany GmbH, Erlangen (DE)

( * ) Notice: Subject to any disclaimer, the term of this patent is extended or adjusted under 35 U.S.C. 154(b) by 63 days.

(21) Appl. No.: 17/452,494

(22) Filed: Oct. 27, 2021

(65) Prior Publication Data

US 2022/0141992 A1 May 5, 2022

(30) Foreign Application Priority Data

Oct. 29, 2020 (DE) ...................... 10 2020 213 629.7

(51) Int. Cl.
*H05K 7/20* (2006.01)
*H02P 27/06* (2006.01)

(52) U.S. Cl.
CPC ........... *H05K 7/2089* (2013.01); *H02P 27/06* (2013.01)

(58) Field of Classification Search
CPC .. H05K 7/2089; H05K 7/20872; H05K 7/209; H05K 7/20881; H05K 7/20245; H02P 27/06
See application file for complete search history.

(56) References Cited

U.S. PATENT DOCUMENTS 6,898,082 B2 * 5/2005 Dessiatoun ........... H01L 23/473
257/722
7,686,070 B2 * 3/2010 Chu ........................ F28F 3/025
165/170

(Continued)

FOREIGN PATENT DOCUMENTS

| IT | BO0020130198 A | 11/2014 |
| JP | 2012-69892 A | 4/2012 |
| JP | 2012069892 A * | 4/2012 |

OTHER PUBLICATIONS

Translation of JP-2012069892-A.*
German Search Report issued in corresponding German Application No. 10 2020 213 629.7, dated Sep. 10, 2021 (9 pages).

*Primary Examiner* — Jayprakash N Gandhi
*Assistant Examiner* — Matthew Sinclair Muir
(74) *Attorney, Agent, or Firm* — Osha Bergman Watanabe & Burton LLP

(57) ABSTRACT

A power module for an inverter is disclosed. The power module has a base plate with a first base plate side and a second, opposite base plate side, controllable electronic switches arranged on the first base plate side, inputs and outputs, which are electrically connected to the electronic switches. The power module is designed to convert an input voltage applied to the inputs to an output voltage applied to the outputs by the electronic switches. The power module also includes a plurality of cooling devices attached to the second base plate side. The cooling devices each have loops arranged one behind the other. The loops of a first group of cooling devices are inclined with respect to the loops of a second group of cooling devices, and/or the loops of each group of cooling devices protrude from the second base plate side to different distances.

10 Claims, 8 Drawing Sheets

(56) References Cited

U.S. PATENT DOCUMENTS

| | | | | |
|---|---|---|---|---|
| 8,081,465 | B2* | 12/2011 | Nishiura | H01L 23/3735 |
| | | | | 361/689 |
| 8,159,823 | B2* | 4/2012 | Murakami | H01L 23/473 |
| | | | | 180/65.31 |
| 2003/0227732 | A1 | 12/2003 | Dessiatoun et al. | |
| 2006/0243429 | A1 | 11/2006 | Chu et al. | |
| 2009/0195990 | A1* | 8/2009 | Honma | H01L 23/3677 |
| | | | | 361/710 |
| 2010/0172091 | A1 | 7/2010 | Nishiura | |
| 2016/0105997 | A1* | 4/2016 | Tiziani | H05K 7/20254 |
| | | | | 165/80.4 |
| 2017/0328280 | A1* | 11/2017 | Hussain | F02K 3/115 |
| 2021/0080197 | A1* | 3/2021 | Carney | F28F 21/08 |

* cited by examiner

POWER MODULE AND POWER ELECTRONICS DEVICE

TECHNICAL FIELD

The invention relates to a power module for a power electronics device, to a power electronics device having such a power module and to an electric drive.

PRIOR ART

Depending on the rated power, during operation of an inverter, as an example of a power electronics device, considerable amounts of waste heat can be generated, which must be dissipated in order to keep the inverter within a permissible operating range. In particular, the electronic switches of the power module heat up to a relatively high degree. Some of this heat is dissipated with the aid of a liquid cooling medium or heat transfer medium. According to the prior art, it is known that loop-shaped cooling devices are arranged in the coolant flow in order to be able to dissipate the waste heat from the power module. This succeeds to a sufficient extent only in part, which significantly limits the rated power of the inverter. Another problem is that the switches of the power module are generally cooled to different degrees and insufficiently cooled switches fail prematurely and thus cause a total failure of the power module or inverter.

DISCLOSURE OF THE INVENTION

One object of the invention is therefore to specify an improved power module for a power electronics device, for example an inverter, an improved power electronics device, for example a power converter, in particular an inverter, and an improved electric drive. In particular, the cooling of the power module should be improved with less technical effort.

The object of the invention is achieved with a power module for a power electronics device, which comprises
  a base plate with a first base plate side and a second, opposite base plate side,
  controllable, electronic switches, which are arranged on the first base plate side or are at least thermally coupled thereto,
  inputs and outputs, which are electrically connected to the electronic switches, wherein the power module is designed to convert an input voltage applied to the inputs to an output voltage applied to the outputs by means of the electronic switches, and
  a plurality of cooling devices attached to the second base plate side or at least thermally coupled thereto,
  wherein the cooling devices each have a plurality of loops arranged one behind the other, and
  wherein the loops of a first group of cooling devices are inclined relative to the loops of a second group of cooling devices and/or the loops of a first group of cooling devices and the loops of a second group of cooling devices protrude from the second base plate side to different distances.

The object of the invention is also achieved with a power electronics device, which comprises a device housing and a power module according to the invention arranged therein. In this case, the base plate of the power module is placed with the second base plate side onto a receptacle in the device housing, wherein a cooling channel is formed, which
  is partially limited by the second base plate side,
  receives the cooling devices,
  has an inlet for connection to a cooling circuit and for an inflow of the cooling fluid,
  has an outlet for connection to the cooling circuit and for an outflow of the cooling fluid and
  through which, during operation, a cooling fluid flows in a main flow direction from the inlet to the outlet.

The power electronics device is designed, for example, as a power converter and, in particular, as an inverter and comprises a DC link capacitor, which is arranged in the device housing and is electrically connected to the inputs of the power module, wherein the power module is set up to convert a DC voltage applied to the inputs to an AC voltage applied to the outputs.

Finally, the object of the invention is achieved by an electric drive, which comprises the inverter according to the invention and an electric machine connected to the outputs of the power module.

The power module is generally provided to convert the input voltage applied to the inputs to the output voltage applied to the outputs. The input voltage is, in particular, a DC voltage, with the result that the inputs are, in particular, DC voltage inputs, and the output voltage is, in particular, an AC voltage, with the result that the outputs are AC voltage outputs.

As a result of the fact that a cooling fluid flows through the cooling channel during operation, the cooling devices, in particular the loops thereof, are in contact with the cooling fluid or heat transfer medium. The proposed measures lead to an increased turbulence in the cooling medium and thus to an improved cooling performance. In particular, cooling capacities for different switches can be matched to one another by locally provided measures, with the result that the switches of the power module are cooled evenly. As a result, it is possible in particular to avoid a situation in which a very early failure of an individual switch leads to a total failure of the power module.

The controllable electronic switches are, in particular, controllable semiconductor switches, such as, for example, IGBTs, and these convert the DC voltage applied to the DC voltage inputs, generally input voltage applied to the inputs, in a generally known manner to an AC voltage applied to the AC voltage outputs, generally to an output voltage applied to the outputs. The AC voltage is, in particular, a multiphase AC voltage, preferably a three-phase AC voltage.

The DC link capacitor of the inverter is provided to smooth the DC voltage for the power module. The DC voltage is provided, for example, by a battery, in particular by a rechargeable battery.

It is conceivable here that the loops of the first group and of the second group are inclined in different directions, that is to say both are inclined. In other words, the loops of different groups of cooling devices are in this case inclined in different directions with respect to a normal to the second base plate side. It is also conceivable, however, that the loops of the first group are straight, that is to say are not inclined, and only the loops of the second group are inclined. In other words, in this case only the loops of the second group are inclined with respect to a normal to the second base plate side. The loops of the first group, on the other hand, are oriented normal to the second base plate side. The inclination of the loops of the first and/or second group can be, in particular, a significant inclination of at least 3° degrees, in particular of at least 5° and preferably of at least 10°. However, the inclination is preferably less than 60°, so that the significant inclination is, in particular, between 3° and 60°. These angles of inclination relate to a normal to the second base plate side.

In addition or as an alternative to this, the loops of the first group and of the second group can protrude from the second base plate side to different distances. In other words, a height of a different group measured normal or at right angles to the second base plate side is then different from one another.

The loops can be formed by appropriately shaped metal strips of the cooling devices. A cooling device can be formed by a metal strip that is shaped so as to form a plurality of loops, which lie one behind the other in the longitudinal direction of the cooling device. For example, the metal strips can be soldered or welded onto the base plate. The metal strips are often also attached to the base plate as part of a "bonding process", which is also used to wire integrated circuits.

The cooling device generally has a height measured normal to the second base plate side, a length measured normal to the height, and a width measured normal to the height and length, the width being smaller than the length.

For example, a battery or an accumulator can be connected to the DC voltage inputs and an electric machine, for example a permanently excited synchronous machine or an asynchronous machine, can be connected to the AC voltage outputs. These are preferably designed as three-phase machines, that is to say in a three-phase manner.

A DC link capacitor can also be provided at the DC voltage inputs to smooth the DC voltage supplied by the battery or the accumulator (for example to compensate for power peaks).

The electronic switches can be connected, in particular, in series in pairs and form a plurality of half-bridges. The DC voltage inputs are connected in this case to the outer poles of the half-bridges and the AC voltage outputs are connected to the middle poles of the half-bridge. In particular, the AC voltage outputs can be designed in a three-phase manner. By appropriate, generally known actuation of the half-bridges, a DC voltage applied to the DC voltage inputs can be converted to an AC voltage applied to the AC voltage outputs.

The power module can also have a housing, which accommodates the electronic switches and protects them from environmental influences.

The cooling channel can be of cuboid or at least cuboid-like design, wherein a height of the cooling channel is measured normal to the second base plate side and a length of the cooling channel is greater than a width of the cooling channel.

The power electronics device or the inverter can also have a device housing, which accommodates a driver stage for the electronic switches and, if necessary, a control device for the driver stage. The driver stage is not usually part of the power module, but can at least partially be built into the power module. The device housing can also have further cooling channels for cooling further structural units. The control device can also implement a regulating system for a drive, which comprises the inverter and an electric machine connected to the AC voltage outputs of the power module.

The cooling channel for the power module is preferably at least partially integrated in the inverter housing.

The device housing is preferably made of metal, for example aluminium.

The electric drive can also have a housing, which accommodates a control device for the driver stage or a regulating system for the electric drive. If there is a regulating system for the electric machine, the electric drive is a regulated electric drive. The electric drive can also comprise a gear mechanism connected to the electric machine. As already mentioned further above, the electric drive can be used specifically to drive a vehicle.

Further advantageous embodiments and refinements of the invention arise from the dependent claims and from the description considered in conjunction with the figures.

Eyes of adjacent cooling devices formed by the loops are advantageously offset from one another in a longitudinal direction of the cooling devices. As a result, the turbulence of the cooling medium in the region of the loops can be further increased and thus the cooling effect of the cooling device can be further improved. However, it would also be conceivable for the loops of the cooling device to be arranged in the form of a matrix.

It is also advantageous if all eyes that are formed by the loops point in the same direction. As a result, the flow resistance of the cooling devices remains low. However, it would also be conceivable that the eyes that are formed by the loops of a cooling device all point in different directions. In addition, the eyes of the loops of all cooling devices can point in the same direction, or the eyes of the loops of different cooling devices can also point in different directions.

It is also advantageous if the loops are angled with respect to the longitudinal direction of the cooling device. In particular, this means that the loops can be angled with respect to the longitudinal direction of the cooling device about a vertical axis of the cooling devices running normal to the second base plate side, that is to say they can be inclined not only with respect to a normal to the second base plate side. If the loops are formed by appropriately shaped metal strips of the cooling devices, there are two main options available. For example, sections of the metal strip that lie between the loops can be offset laterally to one another in the transverse direction of the cooling device, which automatically results in an angling of the loops, or the loops are angled without a lateral offset of the metal strip. By angling the loops, the turbulence of the cooling medium in the region of the loops can be further increased and thus the cooling effect of the cooling device can be further improved.

It is also particularly advantageous if
a) a proportion of adjacent cooling devices, the loops of which are inclined relative to one another, is greater in the region of a first switch of the switches than in the region of a second switch of the switches and/or
b) the height of the cooling devices is greater in the region of the first switch than in the region of the second switch and/or
c) a proportion of adjacent cooling devices, the loops of which are offset from one another in a longitudinal direction of the cooling devices, is greater in the region of the first switch than in the region of the second switch and/or
d) an offset of loops of adjacent cooling devices is lower in the region of the first switch than in the region of the second switch and/or
e) a proportion of adjacent cooling devices, the eyes of which point in different directions, is greater in the region of the first switch than in the region of the second switch and/or
f) an angling of loops of adjacent cooling devices is greater in the region of the first switch than in the region of the second switch.

In the above context, it is favourable if the first switch is arranged downstream with respect to the second switch in the main flow direction of the cooling fluid. In other words, the first switch is closer to the outlet of the cooling channel and the second switch is closer to the inlet of the cooling channel. Accordingly, it can be provided that i) a proportion of adjacent cooling devices whose loops are inclined relative to one another, based on the main flow direction of the cooling fluid, is lower upstream than downstream, or a proportion of adjacent cooling devices, whose loops are inclined relative to one another, is lower near the inlet of the cooling channel than near the outlet of the cooling channel and/or
   ii) the height of the cooling devices, based on the main flow direction of the cooling fluid, is lower upstream than downstream, or the height of the cooling devices is lower near the inlet of the cooling channel than near the outlet of the cooling channel and/or
   iii) a proportion of adjacent cooling devices whose loops are offset from one another in a longitudinal direction of the cooling devices, based on the main flow direction of the cooling fluid, is lower upstream than downstream, or a proportion of adjacent cooling devices, whose loops are offset from one another in a longitudinal direction of the cooling devices, is lower near the inlet of the cooling channel than near the outlet of the cooling channel and/or
   iv) an offset of loops of adjacent cooling devices, based on the main flow direction of the cooling fluid, is lower downstream than upstream, or an offset of loops of adjacent cooling devices is lower near the outlet of the cooling channel than near the inlet of the cooling channel and/or
   v) a proportion of adjacent cooling devices whose eyes point in different directions is lower upstream than downstream, or a proportion of adjacent cooling devices whose eyes point in different directions is lower near the inlet of the cooling channel than near the outlet of the cooling channel and/or
   vi) an angling of loops of adjacent cooling devices, based on the main flow direction of the cooling fluid, is lower upstream than downstream, or an angling of loops of adjacent cooling devices is lower near the inlet of the cooling channel than near the outlet of the cooling channel.

The proposed measures can be used to influence a cooling effect for different switches in a targeted manner. For example, a cooling capacity can be the same for all switches, although the temperature of the cooling medium is different. The measures disclosed in points a) to f) or i) to vi) can change gradually or else suddenly. In other words, the measures disclosed in points a) to f) or i) to vi) can be changed from cooling device to cooling device, or there is a relatively drastic change between two adjacent cooling devices, and the measures then remain constant across several cooling devices. In particular, the measures taken in one region of a switch can remain the same, but there are differences in the measures taken between several or all switches.

It is favourable if a longitudinal direction of the cooling devices is oriented transversely to the main flow direction of the cooling fluid and eyes that are formed by the loops are open in the direction of the main flow direction of the cooling fluid. As a result, the flow resistance of the cooling devices remains low.

Finally, it is particularly advantageous if the measures taken in points a) to f) or i) to vi) for a group of first switches, which are assigned to a half-bridge of the inverter, differ from the measures taken in points a) to f) or i) to vi) for a group of second switches, which are assigned to other half-bridges of the inverter, but within a group no differences of the measures taken in points a) to f) or i) to vi) are provided, wherein the first switches are arranged downstream with respect to the second switches in a main flow direction of the cooling fluid. In other words, it can be provided, in particular, that, with regard to the measures taken in points a) to f) or i) to vi), only the switches of a half-bridge arranged furthest downstream differ from the switches of all other half-bridges. According to the prior art, the switches of a half-bridge arranged furthest downstream are often only insufficiently cooled because the cooling medium has already been heated by the switches located upstream. However, the proposed measures can compensate for this. This means that a cooling capacity can be the same for all switches, although the temperature of the cooling medium is different.

The above embodiments and refinements of the invention may be combined in arbitrary fashion.

BRIEF DESCRIPTION OF THE FIGURES

Exemplary embodiments of the invention are illustrated as examples in the appended schematic figures, in which.

DETAILED DESCRIPTION OF THE INVENTION

Initially, it is stated that identical parts in the different embodiments carry the same reference signs or same component designations, but in some cases with different indices. The disclosures of a component contained in the description may accordingly be transferred to another component with the same reference sign or same component designation. Also, the positional data selected in the description, such as e.g. "top", "bottom", "rear", "front", "side" etc. relate to the figure directly described and depicted, and on a position change, should be transferred accordingly to the new position.

Figure 1:
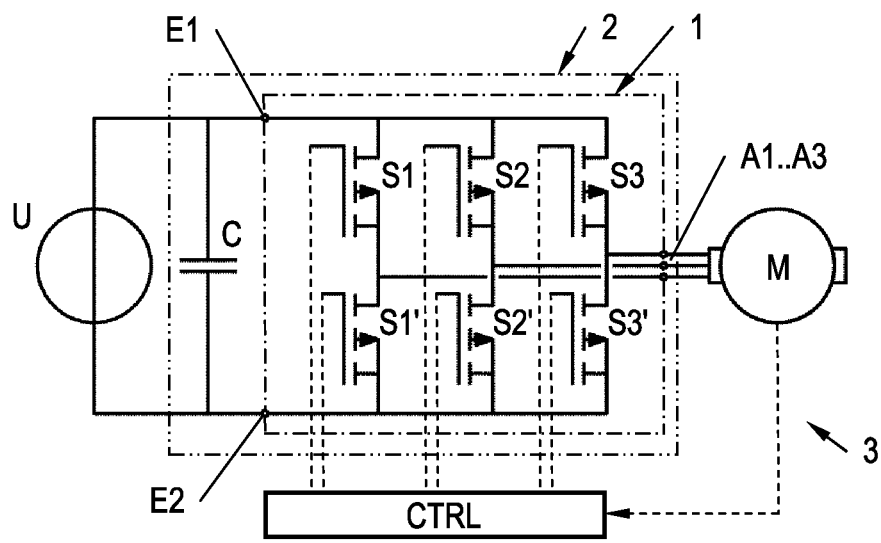
FIG. 1 shows a basic electrical circuit diagram of a power module, an inverter as an example of a power electronics device and an electric drive.

FIG. 1 shows a basic electrical circuit diagram of a power module 1 for an inverter 2, an inverter 2 and an electric drive 3. The power module 1 comprises a plurality of controllable, electronic switches S1 . . . S3' as well as DC voltage inputs E1, E2 and AC voltage outputs A1 . . . A3, which are electrically connected to the electronic switches S1 . . . S3'. The inverter 2 comprises the power module 1 and a DC link capacitor C, which is electrically connected to the DC voltage inputs E1, E2 of the power module 1. A battery or accumulator, which supplies a DC voltage U, is also connected to the DC voltage inputs E1, E2. An electric machine M is connected to the AC voltage outputs A1 . . . A3. The inverter 2 and the electric machine M form an electric drive 3. The inverter 2 can also have a driver stage for the electronic switches S1 . . . S3' and a control device CTRL for the driver stage. In FIG. 1, the driver stage is not illustrated separately, but as part of the control device CTRL. The control device CTRL can also implement a regulating system for the electric drive 3, which system is indicated by the measuring line leading away from the electric machine M. In this case, the electric drive 3 is a regulated electric drive. The electric drive 3 can also comprise a gear mechanism connected to the electric machine M. The electric drive 3 can be used specifically to drive a vehicle (see also FIG. 18). The electric machine M can be designed, for example, as a permanently excited synchronous machine or asynchronous machine. This is preferably designed as a three-phase machine, that is to say in a three-phase manner.

The power module 1 and the inverter 2 each also have their own housing, not illustrated in FIG. 1. The housing of the power module 1 can accommodate the electronic switches S1 . . . S3' and protect them from environmental influences. The housing of the inverter 2 can also accommodate the driver stage for the electronic switches S1 . . . S3' and, if necessary, the control device CTRL. The driver stage is not usually part of the power module 1, but can at least partially be built into the power module 1.

By appropriate, generally known actuation of the half-bridges, a DC voltage U applied to the DC voltage inputs E1, E2 can be converted to an AC voltage applied to the AC voltage outputs A1 . . . A3. To this end, in this example, the electronic switches S1 . . . S3' are connected in pairs in series and form a plurality of half-bridges. The DC voltage inputs E1, E2 are connected in this case to the outer poles of the half-bridges and the AC voltage outputs A1 . . . A3 are connected to the middle poles of the half-bridge. The DC link capacitor C is used here to smooth the DC voltage U supplied by the battery or the accumulator, for example to compensate for power peaks.

In this example, the power module 1 is of three-phase design, but a different number of phases could also be provided.

Figure 2:
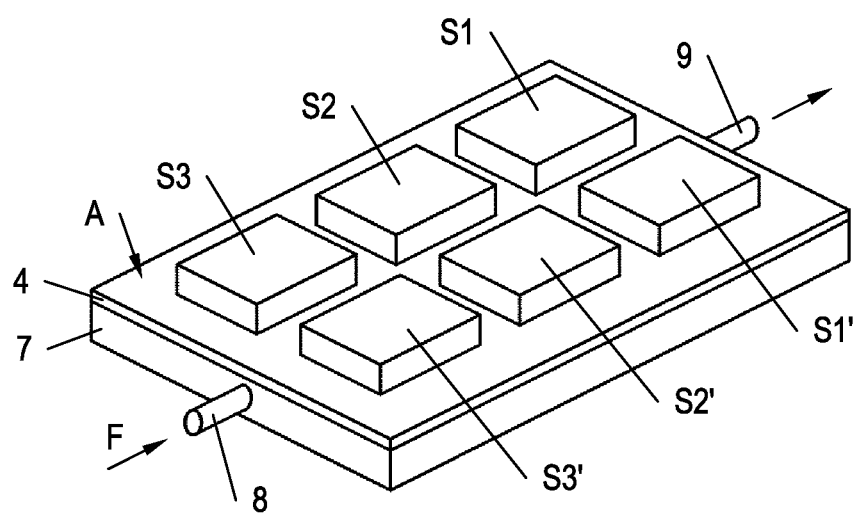
FIG. 2 shows a schematic illustration of the power module in an oblique view from above.
Figure 3:
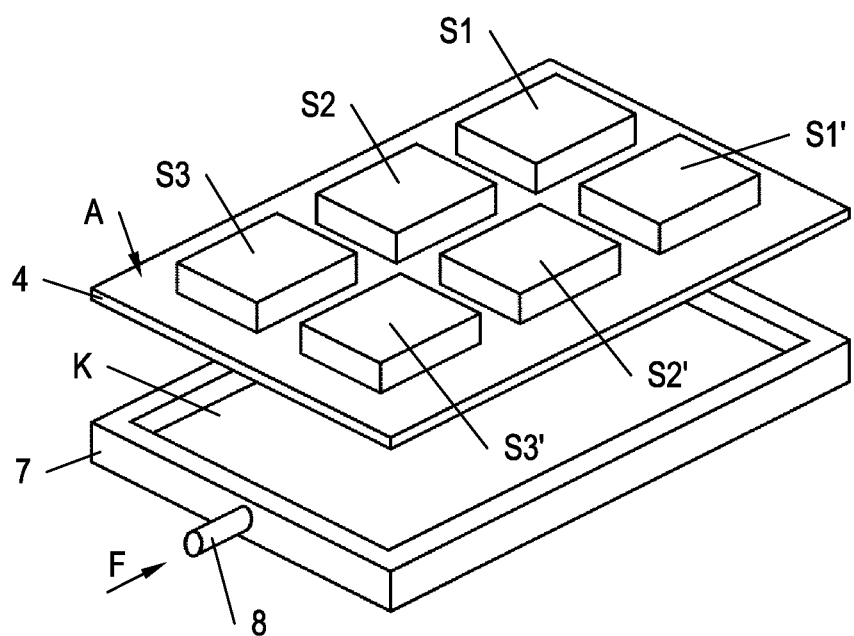
FIG. 3 shows the power module from FIG. 2 in an exploded illustration in an oblique view from above.
Figure 4:
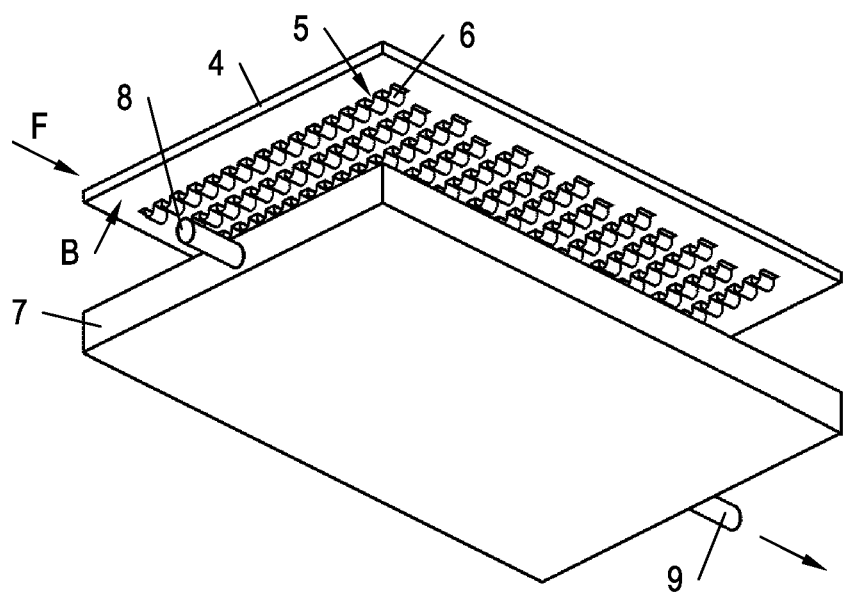
FIG. 4 shows the power module from FIG. 2 in an exploded illustration in an oblique view from below.

FIGS. 2 to 4 show a schematic illustration of the power module 1: FIG. 2 in an oblique view from above, FIG. 3 in an exploded illustration in an oblique view from above and FIG. 4 in an exploded illustration in an oblique view from below.

The power module 1 comprises a base plate 4 with a first base plate side A and a second, opposite base plate side B. The controllable electronic switches S1 . . . S3' are arranged on the first base plate side A or are at least thermally coupled thereto. A plurality of cooling devices 5 are attached to the second base plate side B or at least thermally coupled thereto. The cooling devices 5 each comprise a plurality of loops 6 arranged one behind the other. The loops 6 can be formed by appropriately shaped metal strips of the cooling devices 5. In other words, a cooling device 5 can be formed by a metal strip that is shaped so as to form a plurality of loops 6, which lie one behind the other in the longitudinal direction of the cooling device 5. The metal strips can be soldered or welded onto the base plate 4, in particular as part of a "bonding process".

The inverter 2 has a receptacle 7 in the inverter housing, onto which the base plate 4 is placed with the second base plate side B. The inverter housing is only illustrated schematically in FIGS. 2 to 4 or only in those parts that interact with the power module 1. The inverter housing can, in particular, be larger than illustrated and also be shaped differently. By placing the base plate 4 onto the receptacle 7, a cooling channel K is formed, which is partially limited by the second base plate side B and accommodates the cooling devices 5. In addition, the cooling channel K has an inlet 8 for connection to a cooling circuit and for an inflow of a cooling fluid as well as an outlet 9 for connection to the cooling circuit and for an outflow of the cooling fluid. During operation, the cooling fluid flows through the cooling channel K in a main flow direction F, indicated by arrows, from the inlet 8 to the outlet 9. As a result, the cooling devices 5 are in direct contact with the cooling fluid or heat transfer medium. The cooling in the inverter 2 is not limited to the power module 1, but the inverter housing can also have further cooling channels for cooling further structural units.

The cooling channel K can, as illustrated in FIGS. 2 to 4, be cuboid or also, for example, have rounded corners and edges and thus be of cuboid-like design. A height of the cooling channel K is generally measured normal or at right angles to the second base plate side B. A length of the cooling channel K is greater than a width of the cooling channel K.

FIGS. 5 to 10 now show various arrangements of the cooling devices 5 or loops 6, each in a front view or in the viewing direction of the main flow direction F of the cooling fluid. The loops 6a of a first group of cooling devices 5 are illustrated here in black and the loops 6b of a second group are illustrated in white.

Figure 5:
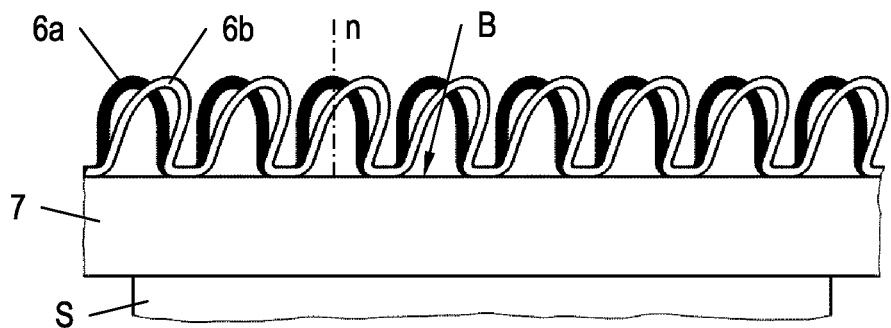
FIG. 5 shows a cooling device in front view with loops inclined in relation to one another.

In the example illustrated in FIG. 5, the loops 6a of the first group are straight, that is to say not inclined, and only the loops 6b of the second group are inclined. In other words, in this case only the loops 6b of the second group are inclined with respect to a normal n to the second base plate side B. The loops 6a of the first group, on the other hand, are oriented normal to the second base plate side B.

Figure 6:
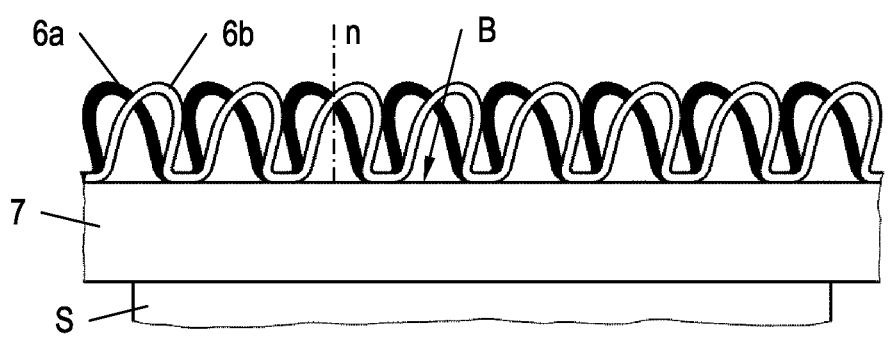
FIG. 6 shows a cooling device in front view with loops that are inclined in opposite directions.

In the example illustrated in FIG. 6, the loops 6a of the first group and the loops 6b of the second group are inclined in different directions, that is to say both are inclined. In other words, the loops 6a, 6b of different groups of cooling devices 5 are in this case inclined in different directions with respect to a normal n to the second base plate side B. It would also be conceivable that the loops 6a, 6b of different groups of cooling devices 5 are inclined in the same direction, but have different angles of inclination.

The inclination of the loops 6a, 6b of the first and/or second group can generally be a clear inclination of, for example, more than 3° degrees.

Figure 7:
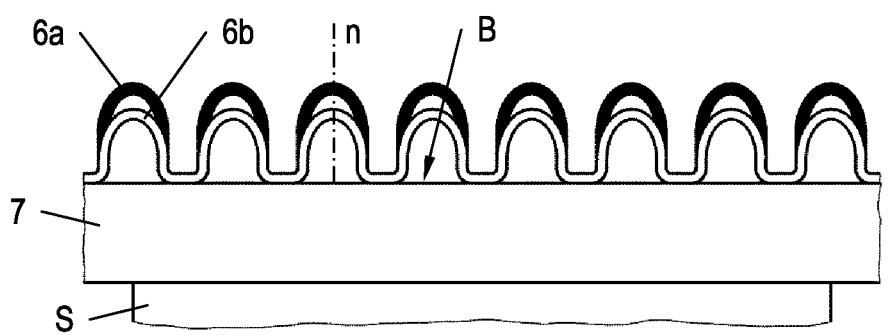
FIG. 7 shows a cooling device in front view with loops protruding from the base plate to different distances.

FIG. 7 shows an example in which the loops 6a of a first group of the cooling devices 5 and the loops 6b of a second group of the cooling devices 5 protrude from the second base plate side B to different distances. In other words, a height of a different group measured normal or at right angles to the second base plate side B is then different from one another.

Figure 8:
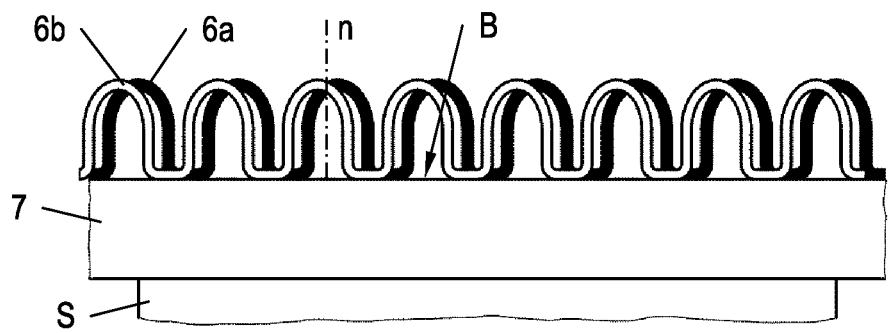
FIG. 8 shows a cooling device in front view with loops with single offset.
Figure 9:
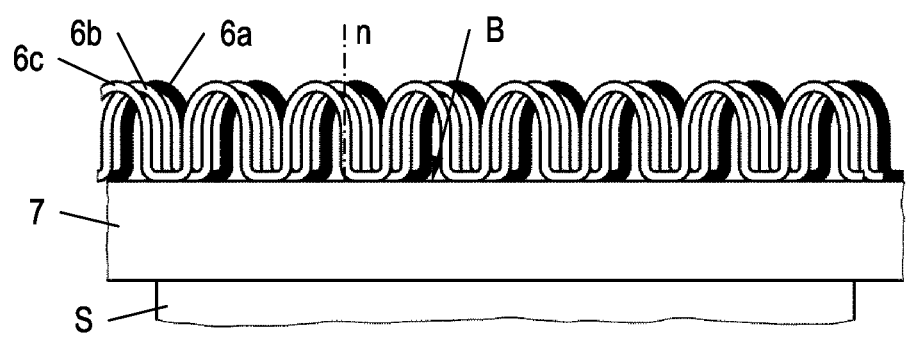
FIG. 9 shows a cooling device in front view with loops with double offset.

FIGS. 8 and 9 show examples in which eyes of adjacent cooling devices 5 formed by the loops 6a . . . 6c are offset from one another in a longitudinal direction of the cooling devices 5. In FIG. 8 there is a single offset; in FIG. 9 there is a double offset. The offset in FIG. 8 is thus greater than in FIG. 9. However, it would also be conceivable for the loops 6a, 6b of the cooling devices 5 to be arranged in the form of a matrix, that is to say not to be offset.

Figure 10:
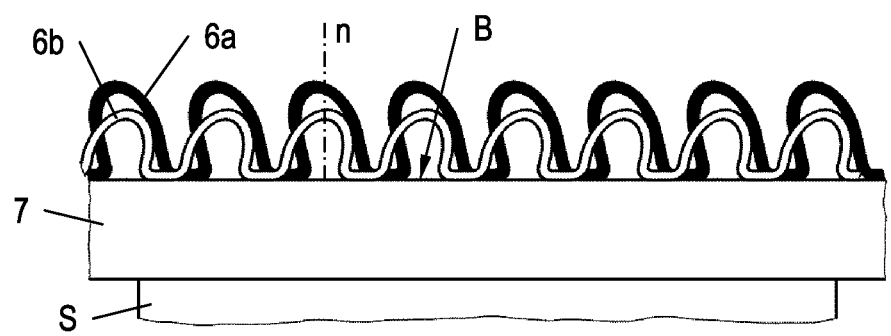
FIG. 10 shows a cooling device in front view with inclined, offset loops of different heights.

The specified measures can also be taken in any desired combination. That is to say, the loops 6a of a first group and the loops 6b of a second group can be inclined and of different heights, inclined and offset, of different heights and offset as well as inclined, of different heights and offset. An example of inclined, offset loops 6a, 6b of different heights is represented in FIG. 10.

Figure 11:
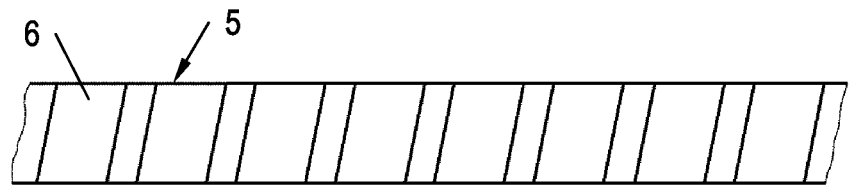
FIG. 11 shows a cooling device in plan view with angled loops without a lateral offset of the metal strip.
Figure 12:
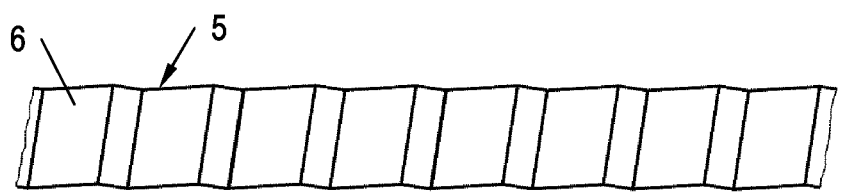
FIG. 12 shows a cooling device in plan view with angled loops with a lateral offset of the metal strip.

In a further embodiment, the loops 6 are angled with respect to the longitudinal direction of the cooling device 5. In particular, this means that the loops 6 can be angled with respect to the longitudinal direction of the cooling device 5 about a vertical axis n of the cooling devices 5 running normal to the second base plate side. If the loops 6 are formed by appropriately shaped metal strips of the cooling devices, there are two main options available. For example, sections of the metal strip, which lie between the loops 6, can be angled without a lateral offset of the metal strip, as is illustrated in FIG. 11. It is also conceivable, however, that an angling of the loops 6 takes place in the transverse direction of the cooling device 5 by way of a lateral offset of the sections of the metal strip, which lie between the loops 6, as is illustrated in FIG. 12. This offset automatically angles the loops 6.

In general, it is conceivable that all eyes that are formed by the loops 6 point in the same direction. However, it would also be conceivable that the eyes that are formed by the loops 6 of a cooling device 5 all point in different directions. In addition, the eyes of the loops 6 of all cooling devices 5 can point in the same direction, or the eyes of the loops 6 of different cooling devices 5 can also point in different directions.

In general, a longitudinal direction of the cooling devices 5 is preferably oriented transversely to the main flow direction F of the cooling fluid and the eyes that are formed by the loops 6 are open in the direction of the main flow direction F of the cooling fluid.

At this point it should be noted that an angling of the loops 6 can also be used in any desired combination with an inclination of the loops 6, with a different height of the loops 6 or with an offset of the loops 6.

Figure 13:
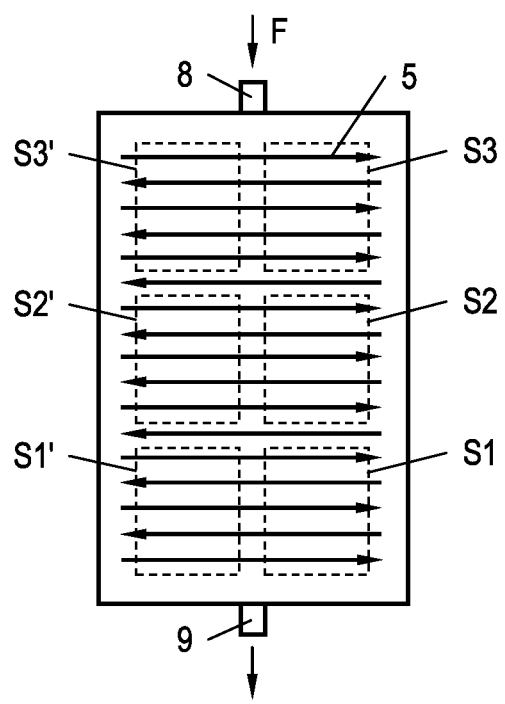
FIG. 13 shows a plan view of the second base plate side, in which the cooling devices 5 are illustrated schematically as arrows, and measures for the loops are evenly distributed.

In general, the proposed measures can be applied in an equally distributed manner over the entire second base plate side B or over the entire second base plate side B in the region of the switches S1 . . . S3'. FIG. 13 shows an example of this in a plan view of the second base plate side B, in which the cooling devices 5 are illustrated schematically as arrows. The arrows in this case indicate the direction of inclination of the loops 6a, 6b. In the example shown, the loops 6a, 6b of adjacent cooling devices 5 are each mutually inclined, as is also illustrated in FIG. 6. The arrows in FIG. 13 represent the inclination of the loops 6a, 6b, but they can also indicate a different height of the loops 6a, 6b, an offset of the loops 6a, 6b or a different angling of the loops 6a, 6b as well as any desired combination of the proposed measures. For example, an arrow pointing to the right can indicate higher loops 6a and an arrow pointing to the left can indicate loops 6b of a lower height (see also FIG. 7). An arrow pointing to the right can also indicate loops 6a that are offset to the right and an arrow pointing to the left can indicate loops 6b that are offset to the left (see also FIG. 8). An arrow pointing to the right can also indicate loops 6a that are angled to the right and an arrow pointing to the left can indicate loops 6b that are angled to the left (see also FIGS. 11 and 12).

However, the equal distribution of the proposed measures is not mandatory. In the case of a power module 1, it is also advantageous if a) a proportion of adjacent cooling devices 5, the loops 6a, 6b of which are inclined relative to one another, is greater in the region of a first switch S1, S1' of the switches S1 . . . S3' than in the region of a second switch S2, S2' of the switches S1 . . . S3' and/or b) the height of the cooling devices 5 is greater in the region of the first switch S1, S1' than in the region of the second switch S2, S2' and/or c) a proportion of adjacent cooling devices 5, the loops 6a, 6b of which are offset from one another in a longitudinal direction of the cooling devices 5, is greater in the region of the first switch S1, S1' than in the region of the second switch S2, S2' and/or d) an offset of loops 6a, 6b of adjacent cooling devices 5 is lower in the region of the first switch S1, S1' than in the region of the second switch S2, S2' and/or e) a proportion of adjacent cooling devices 5, the eyes of which point in different directions, is greater in the region of the first switch S1, S1' than in the region of the second switch S2, S2' and/or f) an angling of loops 6a, 6b of adjacent cooling devices 5 is greater in the region of the first switch S1, S1' than in the region of the second switch S2, S2'.

The first switch S1, S1' is preferably arranged downstream with respect to the second switch S2, S2' in the main flow direction F of the cooling fluid. In other words, the first switch S1, S1' is closer to the outlet 9 of the cooling channel K and the second switch S2, S2' is closer to the inlet 8 of the cooling channel K. Accordingly, it can be provided that i) a proportion of adjacent cooling devices 5 whose loops 6a, 6b are inclined relative to one another, based on the main flow direction F of the cooling fluid, is lower upstream than downstream, or a proportion of adjacent cooling devices 5, whose loops 6a, 6b are inclined relative to one another, is lower near the inlet 8 of the cooling channel K than near the outlet 9 of the cooling channel K and/or ii) the height of the cooling devices 5, based on the main flow direction F of the cooling fluid, is lower upstream than downstream, or the height of the cooling devices 5 is lower near the inlet 8 of the cooling channel K than near the outlet 9 of the cooling channel K and/or iii) a proportion of adjacent cooling devices 5 whose loops 6a, 6b are offset from one another in a longitudinal direction of the cooling devices, based on the main flow direction F of the cooling fluid, is lower upstream than downstream, or a proportion of adjacent cooling devices, whose loops 6a, 6b are offset from one another in a longitudinal direction of the cooling devices 5, is lower near the inlet 8 of the cooling channel K than near the outlet 9 of the cooling channel K and/or iv) an offset of loops 6a, 6b of adjacent cooling devices 5, based on the main flow direction F of the cooling fluid, is lower downstream than upstream, or an offset of loops 6a, 6b of adjacent cooling devices 5 is lower near the outlet 9 of the cooling channel K than near the inlet 8 of the cooling channel K and/or v) a proportion of adjacent cooling devices 5 whose eyes point in different directions is lower upstream than downstream, or a proportion of adjacent cooling devices 5 whose eyes point in different directions is lower near the inlet 8 of the cooling channel K than near the outlet 9 of the cooling channel K and/or vi) an angling of loops 6a, 6b of adjacent cooling devices 5, based on the main flow direction F of the cooling fluid, is lower upstream than downstream, or an angling of loops 6a, 6b of adjacent cooling devices 5 is lower near the inlet 8 of the cooling channel K than near the outlet 9 of the cooling channel K.

The measures disclosed in points a) to f) or i) to vi) can change gradually or else suddenly. In other words, the measures disclosed in points a) to f) and i) to vi) can be changed from cooling device 5 to cooling device 5, or there is a relatively drastic change between two adjacent cooling devices 5, and the measures then remain constant across several cooling devices 5. In particular, the measures taken in one region of a switch S1 . . . S3' can remain the same, but there are differences in the measures taken between several or all switches S1 . . . S3'.

The measures taken in points a) to f) or i) to vi) for a group of first switches S1, S1', which are assigned to a half-bridge of the inverter 2, preferably differ from the measures taken in points a) to f) or i) to vi) for a group of second switches S2 . . . S3', which are assigned to other half-bridges of the inverter 2, but within a group no differences of the measures taken in points a) to f) or i) to vi) being provided, wherein the first switches S1, S1' are arranged downstream with respect to the second switches S2 . . . S3' in a main flow direction F of the cooling fluid. In other words, it can be provided, in particular, that, with regard to the measures taken in points a) to f) or i) to vi), only the switches S1, S1' of a half-bridge arranged furthest downstream differ from the switches S2 . . . S3' of all other half-bridges.

Figure 14:
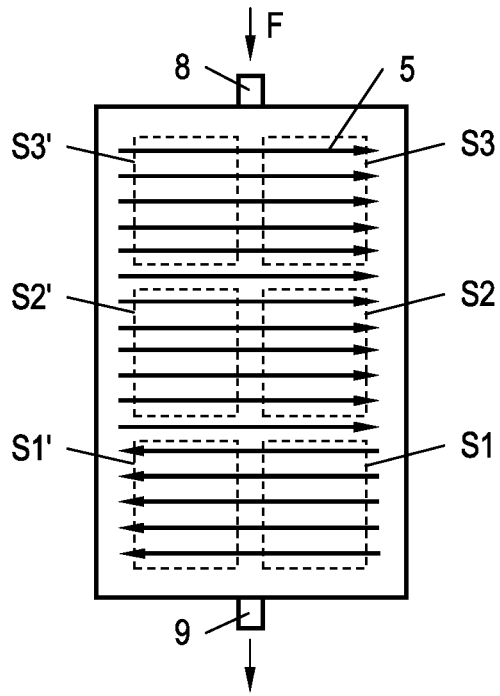
FIG. 14 is similar to FIG. 13, only with loops that are inclined differently in the region of groups of first and second switches.

FIG. 14 in this respect shows an example in which the loops 6a in the region of the group of first switches S1, S1' are inclined to the left and the loops 6b in the region of the group of second switches S2 . . . S3' are inclined to the right.

Figure 15:
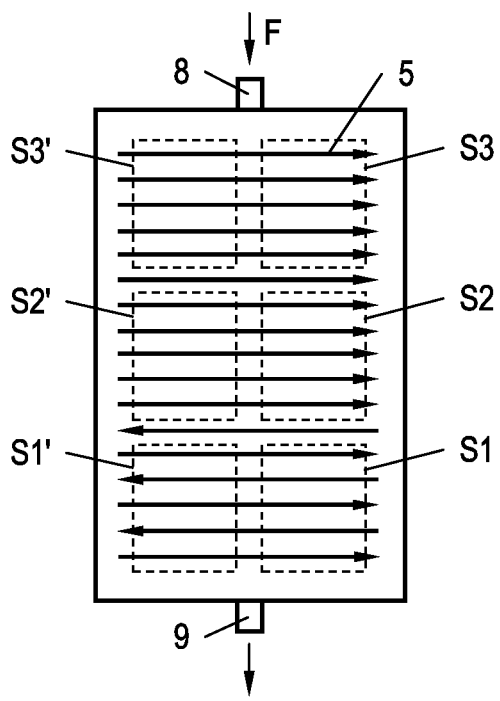
FIG. 15 is likewise similar to FIG. 13, and with loops that are inclined differently in the region of groups of first and second switches.

FIG. 15 shows a further example in which the loops 6a in the region of the group of first switches S1, S1' are inclined alternately to the left and to the right and the loops 6b in the region of the group of second switches S2 . . . S3' are inclined only to the right.

Figure 16:
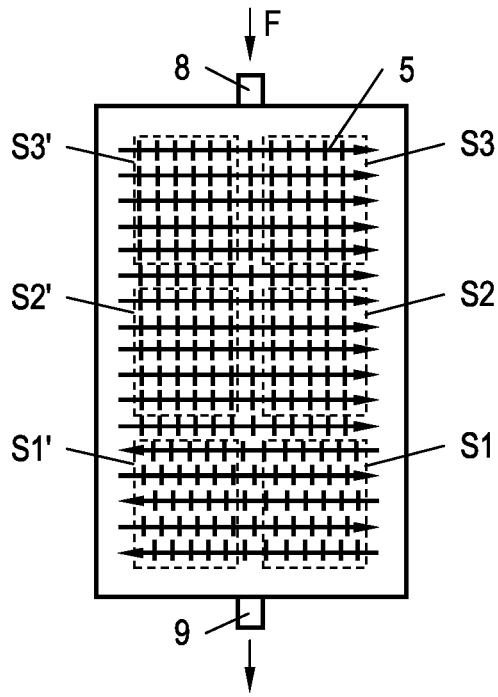
FIG. 16 is similar to FIG. 13, only with loops that are inclined and offset differently in the region of groups of first and second switches.
Figure 17:
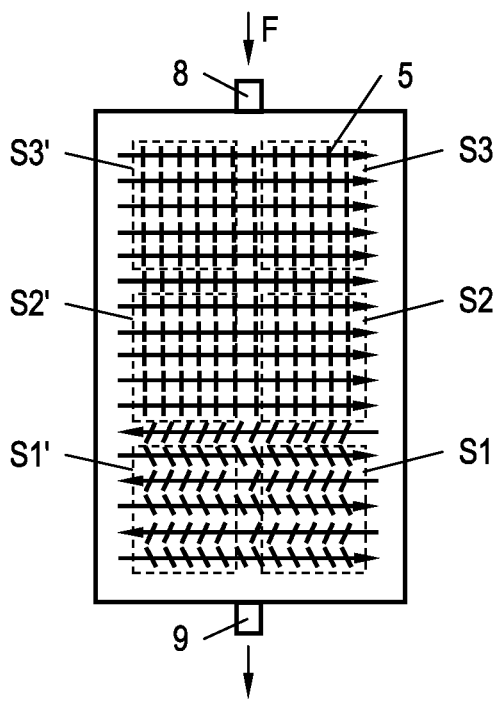
FIG. 17 is similar to FIG. 13, only with loops that are inclined and angled differently in the region of groups of first and second switches.

The arrows in FIGS. 14 and 15 again represent the inclination of the loops 6a, 6b, but they can also indicate a different height of the loops 6a, 6b, an offset of the loops 6a, 6b or a different angling of the loops 6a, 6b as well as any desired combination of the proposed measures. FIGS. 16 and 17 show somewhat more detailed illustrations in this regard, in which the direction of the arrow again indicates the direction of inclination of the loops 6a, 6b, but the horizontal lines additionally also indicate the position and orientation of the loops 6a, 6b. FIG. 16 accordingly discloses an embodiment in which the loops 6a in the region of the group of first switches S1, S1' are inclined alternately to the left and to the right and also are offset with respect to one another and the loops 6b in the region of the group of second switches S2 . . . S3' are inclined only to the right and are also not offset with respect to one another. FIG. 17 also discloses an embodiment in which the loops 6a in the region of the group of first switches S1, S1' are inclined alternately to the left and to the right and also are angled with respect to one another and the loops 6b in the region of the group of second switches S2 . . . S3' are inclined only to the right and are also not angled with respect to one another.

Figure 18:
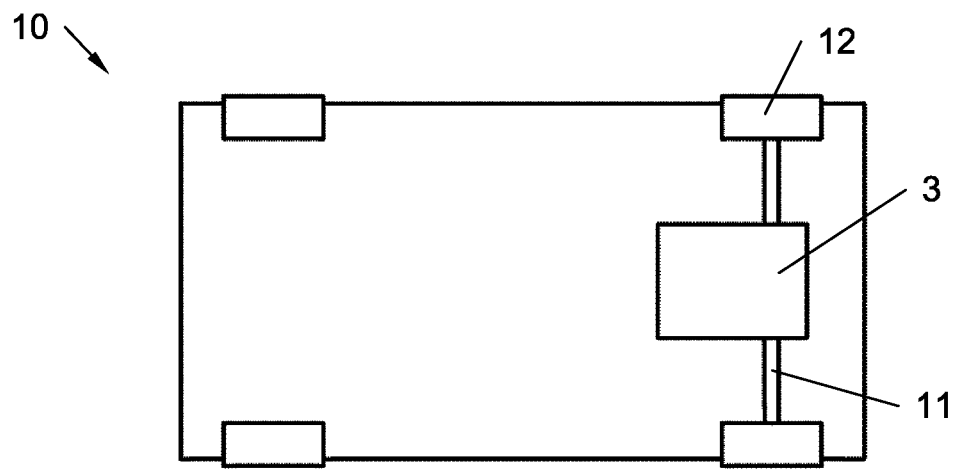
FIG. 18 shows a schematically illustrated vehicle having an electric drive of the proposed type.

FIG. 18 finally shows the electric drive 3 installed in a vehicle 10. The vehicle 10 has at least two axles, at least one of which is driven. Specifically, the electric drive 3 is connected to the half-axles 11 of the rear axle via an optional gear mechanism. Finally, the driven wheels 12 are mounted on the half-axles 11. The drive of the vehicle 10 is provided at least partially or for part of the time by the electric drive 3. This means that the electric drive 3 may serve for solely driving the vehicle 10, or for example may be provided in conjunction with an internal combustion engine (hybrid drive).

Finally, it is established that the scope of protection is determined by the patent claims. The description and the drawings should however serve as reference for interpretation of the claims. The features contained in the figures may be interchanged and combined with one another arbitrarily. In particular, it is also established that the devices illustrated may in reality comprise more or also fewer constituents than illustrated. In some cases, the illustrated devices or their constituents may also not be depicted to scale, and/or may be enlarged and/or reduced.

The invention claimed is:

1. A power module for a power electronics device, comprising:
   a base plate with a first base plate side and a second, opposite base plate side;
   controllable, electronic switches, which are arranged on the first base plate side or are at least thermally coupled thereto;
   inputs and outputs, which are electrically connected to the electronic switches, wherein the power module is configured to convert an input voltage applied to the inputs to an output voltage applied to the outputs by the electronic switches; and
   a plurality of cooling devices attached to the second base plate side or at least thermally coupled thereto,
   wherein the cooling devices each have a plurality of wire loops, formed via metal strips and arranged one behind the other,
   wherein the wire loops of a first group of cooling devices are inclined relative to the wire loops of a second group of cooling devices and/or the wire loops of a first group of cooling devices and the wire loops of a second group of cooling devices protrude from the second base plate side to different distances,
   wherein, when viewed from a plan view of the second base plate, respective planes of each of the plurality of wire loops are angled with respect to a longitudinal direction of the cooling device,
   wherein sections of the metal strips lying between the wire loops are laterally offset to angle the respective planes of each of the wire loops,
   wherein a proportion of adjacent cooling devices, the wire loops of which are offset from one another in the longitudinal direction of the cooling devices, is greater in a region of a first switch of the switches than in a region of a second switch of the switches, and wherein an offset of wire loops of adjacent cooling devices is smaller in the region of the first switch than in the region of the second switch, and wherein an angle of the wire loops of the adjacent cooling devices is greater in the region of the first switch than in the region of the second switch.

2. The power module according to claim 1, wherein eyes of adjacent cooling devices formed by the wire loops are offset from one another in the longitudinal direction of the cooling devices.

3. The power module according to claim 1, wherein all eyes that are formed by the wire loops point in the same direction.

4. The power module according to claim 1, wherein:
the proportion of adjacent cooling devices, the wire loops of which are inclined relative to one another, is greater in the region of the first switch than in the region of the second switch, and/or
the proportion of adjacent cooling devices, the eyes of which point in different directions, is greater in the region of the first switch than in the region of the second switch.

5. A power electronics device, comprising:
a device housing; and
the power module according to claim 1, arranges in the device housing,
wherein the base plate of the power module is placed with the second base plate side onto a receptacle in the device housing, and
wherein a cooling channel is formed, which is partially limited by the second base plate side, receives the cooling devices, has an inlet for connection to a cooling circuit and for an inflow of a cooling fluid, and has an outlet for connection to the cooling circuit and for an outflow of the cooling fluid and through which, during operation, the cooling fluid flows in a main flow direction from the inlet to the outlet.

6. The power electronics device according to claim 5, wherein the longitudinal direction of the cooling devices is oriented transversely to the main flow direction of the cooling fluid and eyes that are formed by the wire loops are open in the direction of the main flow direction of the cooling fluid.

7. The power electronics device according to claim 5, wherein the first switch is arranged downstream with respect to the second switch in the main flow direction of the cooling fluid.

8. The power electronics device according to claim 7, wherein an attribute of cooling devices corresponding to a group of first switches, which are assigned to a half-bridge of an inverter, differs from an attribute of cooling devices corresponding to a group of second switches, which are assigned to other half-bridges of the inverter, but within the cooling devices corresponding to the respective group of switches the attribute is the same, wherein the first switches are arranged downstream with respect to the second switches in a main flow direction of the cooling fluid.

9. An inverter comprising: the power electronics device according to claim 5, having a DC link capacitor, which is arranged in the device housing and is electrically connected to the inputs of the power module, wherein the power module is set up to convert a DC voltage applied to the inputs to an AC voltage applied to the outputs.

10. An electric drive, comprising: the inverter according to claim 9; and an electric machine connected to the outputs of the power module.

* * * * *